United States Patent
Hsieh et al.

(10) Patent No.: US 9,228,764 B2
(45) Date of Patent: Jan. 5, 2016

(54) COOLING HEAD FOR TEMPERATURE-CONTROL PHASE CHANGE COOLER

(71) Applicants: De-Yin Hsieh, Kaohsiung (TW); De-Fong Hsieh, Kaohsiung (TW)

(72) Inventors: De-Yin Hsieh, Kaohsiung (TW); De-Fong Hsieh, Kaohsiung (TW)

( * ) Notice: Subject to any disclaimer, the term of this patent is extended or adjusted under 35 U.S.C. 154(b) by 254 days.

(21) Appl. No.: 14/067,349

(22) Filed: Oct. 30, 2013

(65) Prior Publication Data
US 2014/0360225 A1 Dec. 11, 2014

(30) Foreign Application Priority Data
Jun. 6, 2013 (TW) .............................. 102210639 U

(51) Int. Cl.
*F25B 39/02* (2006.01)
*F25D 19/00* (2006.01)
*F28D 15/02* (2006.01)

(52) U.S. Cl.
CPC .............. *F25B 39/02* (2013.01); *F25D 19/006* (2013.01); *F28D 15/0266* (2013.01)

(58) Field of Classification Search
CPC ........................... F25B 39/02; F25B 2339/023
USPC ......................... 62/516, 515, 517, 304, 259.4
See application file for complete search history.

(56) References Cited

U.S. PATENT DOCUMENTS

| | | | | |
|---|---|---|---|---|
| 3,124,696 A | * | 3/1964 | Tucker | F01K 25/10 290/52 |
| 4,467,861 A | * | 8/1984 | Kiseev | F28D 15/043 165/104.22 |

* cited by examiner

*Primary Examiner* — Melvin Jones

(57) ABSTRACT

A cooling head for a temperature-controlled phase change cooler has a main body, an evaporating chamber within the main body, at least two cap tubes and at least a heat source mounted onto the periphery of the evaporating chamber. With one of the cap tubes, the coolant is guided into the evaporating chamber, then the cooling head of the phase change cooler could be quickly cooled down due to rapid heat absorption characteristic of the evaporated coolant. In such a case, a heat source is used for heating by a control mechanism, and the temperature could be adjusted to a desired temperature point within the limited range of low temperature according to the user demands. When the preset temperature point is higher than normal temperature, the control mechanism could change properly the flux via one of two cap tubes, and provide proper amount of coolant for evaporative cooling.

1 Claim, 5 Drawing Sheets

COOLING HEAD FOR TEMPERATURE-CONTROL PHASE CHANGE COOLER

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a cooling head for temperature-control phase change cooler, and more particularly to an innovative one which is designed to control the temperature of the cooling head for chip tests by at least two flow-controlled cap tubes and a heat source mounted externally on the evaporating chamber.

2. Description of Related Art Including Information Disclosed Under 37 CFR 1.97 and 37 CFR 1.98.

In conventional design, a common cooling head is interconnected to a compressor, a condenser, a coolant controller and an evaporator (a cooling head hereto) to constitute a closed cooling circulatory system. In operation, the low-temperature and low-pressure coolant is compressed by the compressor into high-temperature and high-pressure gaseous coolant, which is then cooled by the condenser into high-temperature liquid coolant. Next, the liquid coolant is depressurized by the coolant controller, and guided into the evaporating chamber of the cooling head for evaporation into low-temperature and low-pressure gaseous coolant, and then returned to the compressor for another cooling cycle. With the cooling mode of the compressor, the high temperature generated from the performance test of electronic components (chips) could be carried away. However, since the compressor only enables the operation of the cooling head in low-temperature state, the desired temperature point in the high-temperature range could not be effected or maintained. The extremely high temperature of the coolant returned to the compressor will reduce the service life or even cause failure or damage of the compressor. In the industrial field, there is a CPU single stage phase change unit similar to this innovative structure; however, its cooling head can only be used for low-temperature cooling, rather than adjusting the temperature to a desired temperature point in high-temperature zone. As a result, its range of application is limited to CPU single-stage cooling for computers.

BRIEF SUMMARY OF THE INVENTION

The primary objective of this utility model is to provide a cooling head for temperature-control phase change cooler.

The cooling head for temperature-control phase change cooler of the present invention comprises: a main body; an evaporating chamber within the main body; at least two flow-controlled cap tubes; and at least a heat source mounted onto the periphery of the evaporating chamber.

Said heat source of the utility model is an electric heating tube, which is inserted into at least a slot of the main body.

Said heat source of the utility model is an electric heating strip, which is covered securely onto the periphery of the evaporating chamber.

With the heat source, the temperature of the evaporating chamber can be adjusted to a desired temperature suitable for the temperature-controlled test of various electronic components (chips) (e.g.: Jedec Standard of USA JEDEC Solid State Technology Association).

DETAILED DESCRIPTION OF THE INVENTION

Figure 1:
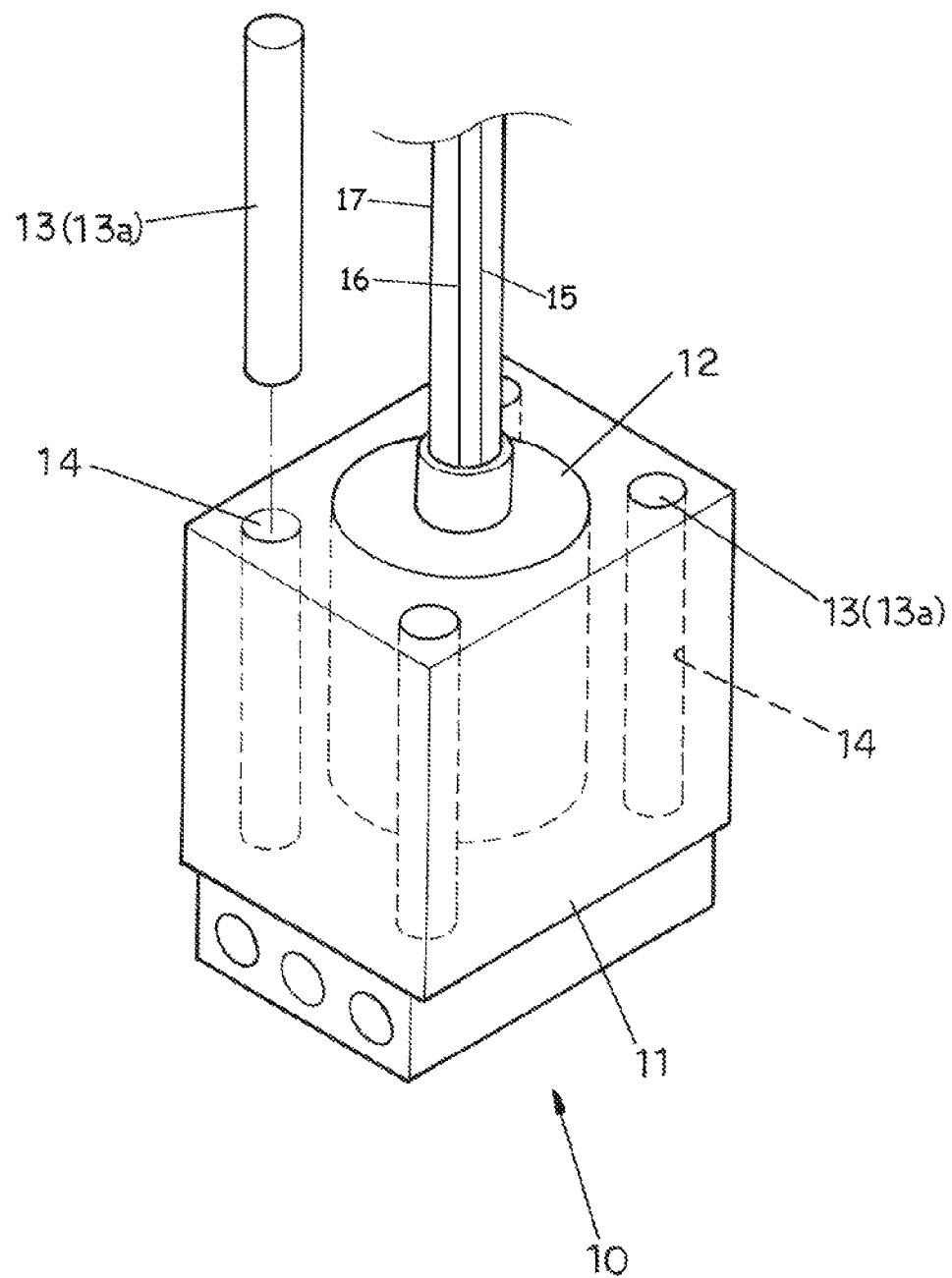
FIG. 1 is a perspective view of the cooling head of the present invention.

Referring to FIG. 1, the cooling head of the utility model 10 comprises a main body 11, an evaporating chamber 12 within the main body 11, and at least a heat source 13 mounted onto periphery of the evaporating chamber 12.

Figure 2:
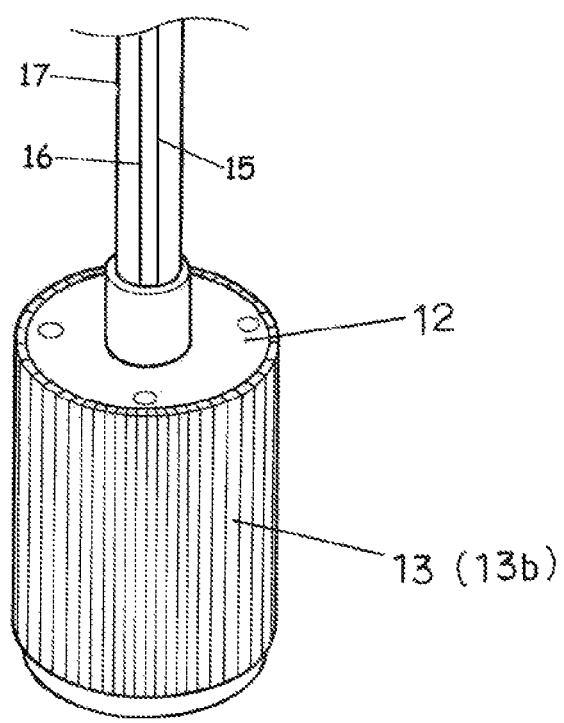
FIG. 2 is another perspective view of the cooling head of the present invention.

Said cooling head 10 is of a round pattern. Referring to FIG. 2, said cooling head 10 is provided with a main body 11, an evaporating chamber 12 within the main body 11, and at least, a heat source 13 covered onto the periphery of the evaporating chamber 12.

Said heat source 13 is set on the periphery of the evaporating chamber 12 in the following two ways.

Figure 3:
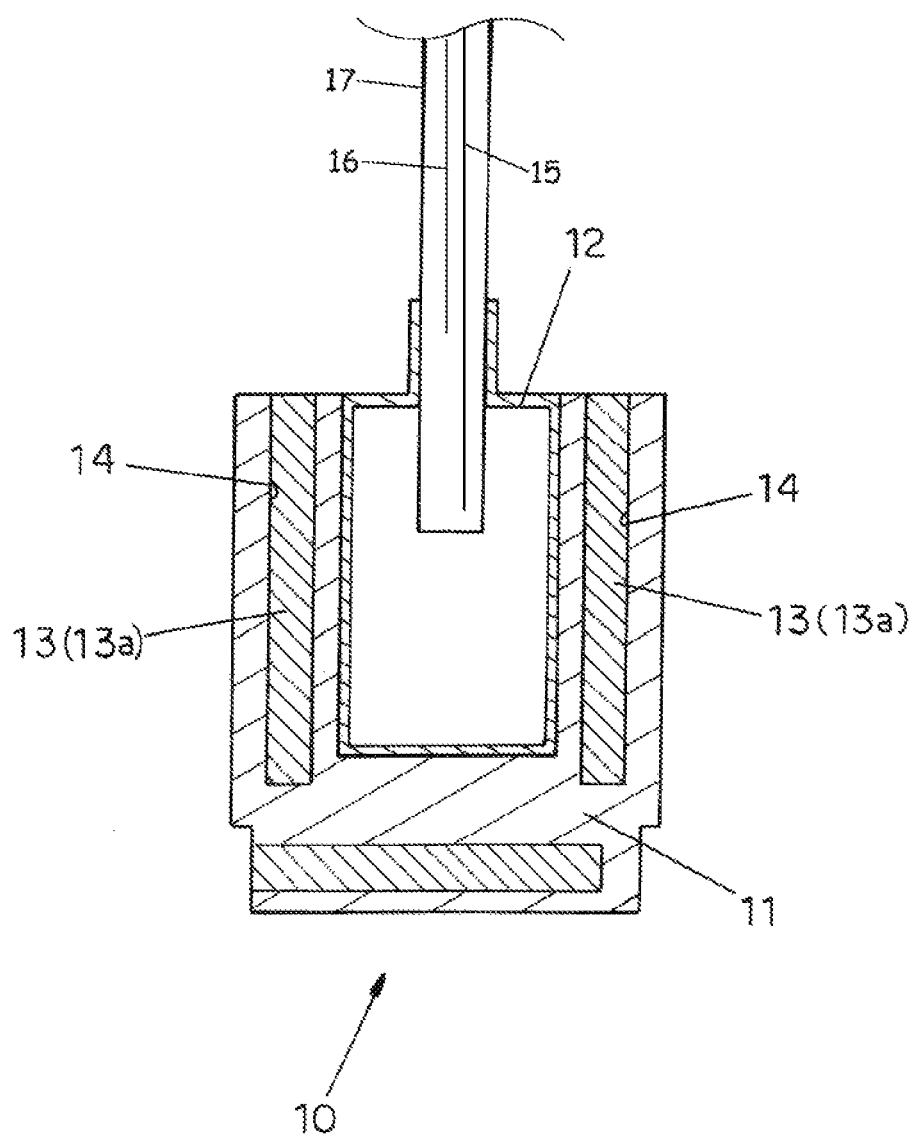
FIG. 3 is an assembled sectional view of the cooling head showing that at least an electric heating tube is inserted into a slot.

Referring to FIG. 3, said heat source 13 is an electric heating tube 13a, which is inserted into at least a slot 14 of the main body 11.

Figure 4:
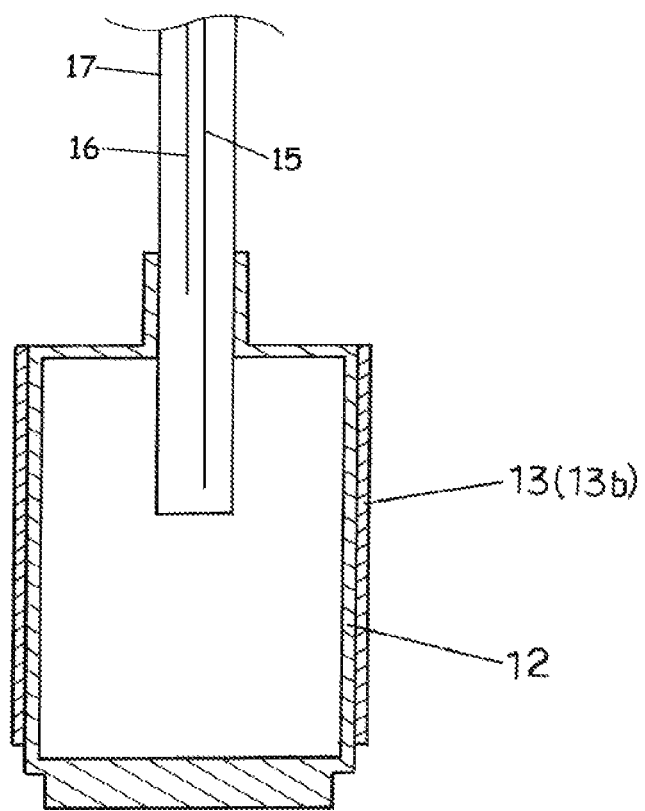
FIG. 4 is another assembled sectional view of the cooling head showing that at least an electric heating-strip is covered onto the periphery of an evaporating chamber.

Referring to FIG. 4, said heat source 13 is an electric heating strip 13b, which is covered onto the periphery of the evaporating chamber 12.

Figure 5:
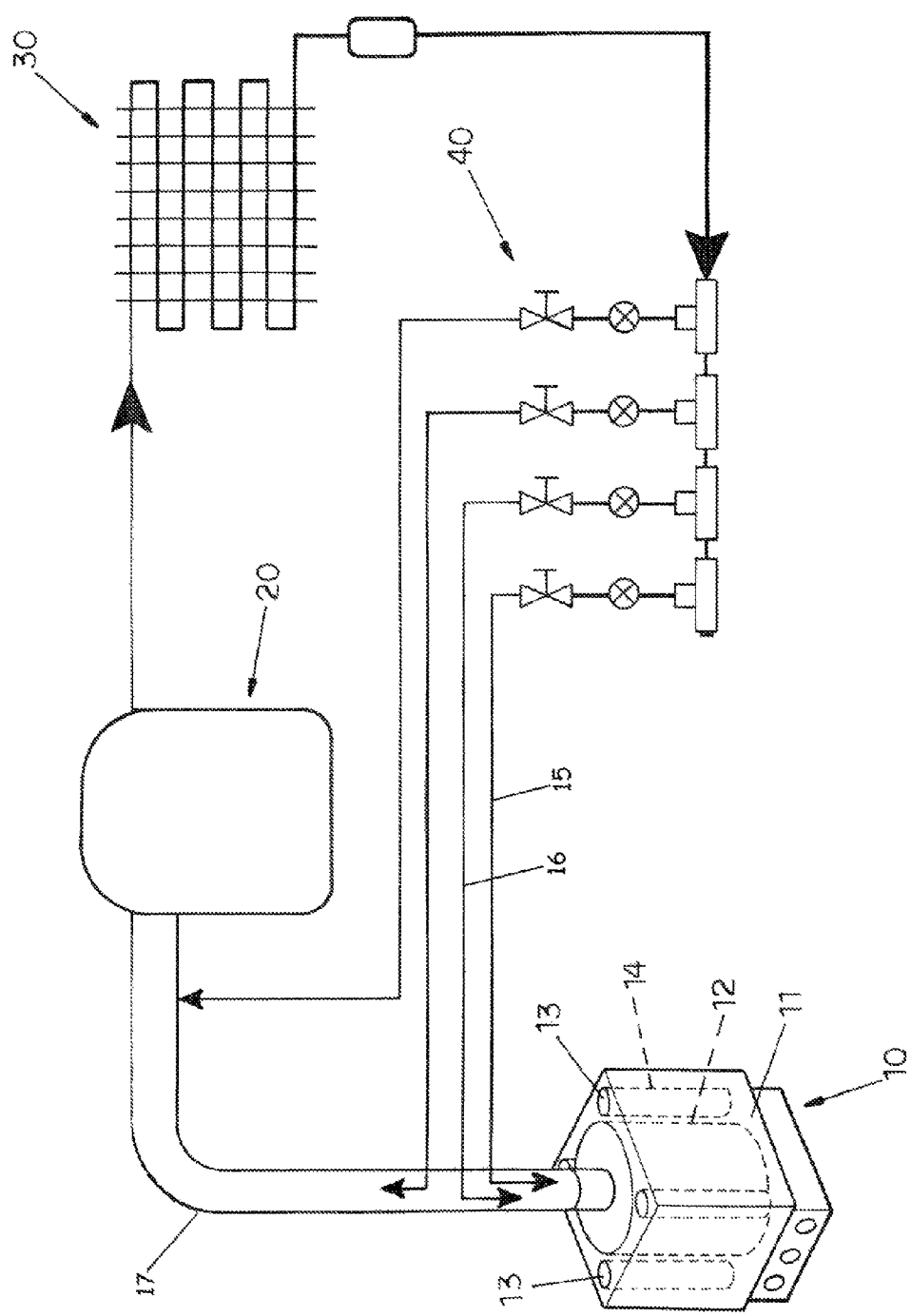
FIG. 5 is an assembled plane view of the operating status of the cooling head showing that the coolant is output by a compressor to the cooling head through a condenser, a coolant controller and cap tube, and then back into the return pipe of the compressor.

Referring to FIG. 5, the cooling head 10 of the utility model is linked to an electronic component (not shown herein), and interconnected with a compressor 20, a condenser 30 and a flow controller 40 via a coolant return pipe 17 and at least two cap tubes 15, 16. The coolant is compressed by the compressor 20 and cooled down by the condenser 30. Next, the coolant flow is controlled and depressurized by the flow controller 40 and guided into the evaporating chamber 12 of the cooling head 10 through the cap tube, subsequently returned to the compressor 20 as gaseous coolant for another cooling cycle. Said cooling head 10 could be heated by at least a heat source 13, such that the temperature of the cooling head could be adjusted to any desired temperature point suitable for the load temperature required for test of various electronic components (ICs).

Hence, the utility model has the following inventiveness as compared with prior art.

First, at least a heat source 13 is mounted on the periphery of the evaporating chamber 12 of the cooling head 10. With the beat source 13, the temperature, of the evaporating chamber 12 could be adjusted. Besides, one of at least two cap tubes enables to prevent extremely high temperature of return coolant, thus avoiding damage of the compressor to ensure its service life.

Second, the temperature of said cooling bead 10 could be adjusted to meet the load Temperature requirement of various electronic components (ICs) as per relevant standards (e.g.: Jedec standard of USA JEDEC Solid State Technology Association).

The innovative cooler of the utility model could adjust the temperature to any desired temperature point, and also automatically change the coolant flax for optimal loading capacity and evaporating volume according to various load requirements of the users. The Claims are made hereto due to its unlimited applications and value.

Although the invention has been explained in relation to its preferred embodiment, it is to be understood that many other possible modifications and variations can be made without departing from the spirit and scope of the invention as hereinafter claimed.

We claim:

1. A cooling head for a temperature-control phase change cooler comprising:
    a main body;
    an evaporating chamber within the main body;
    at least two flow-controlled cap tubes; and
    a least one heat source mounted onto a periphery of the evaporating chamber, and said heat source being an electric heating tube, which is inserted into at least one slot of the main body.

* * * * *